United States Patent
Tierney et al.

(10) Patent No.: US 9,574,049 B2
(45) Date of Patent: Feb. 21, 2017

(54) POLYMERS, THEIR PREPARATION AND USES

(75) Inventors: Brian Tierney, Cambridgeshire (GB); Ilaria Grizzi, Cambridge (GB); Clare Foden, Cambridge (GB); Nalin Patel, Cambridge (GB); Mark Leadbeater, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 10/548,929

(22) PCT Filed: Mar. 19, 2004

(86) PCT No.: PCT/GB2004/001207
§ 371 (c)(1),
(2), (4) Date: May 8, 2006

(87) PCT Pub. No.: WO2004/083277
PCT Pub. Date: Sep. 30, 2004

(65) Prior Publication Data
US 2006/0234083 A1  Oct. 19, 2006

(30) Foreign Application Priority Data
Mar. 20, 2003 (GB) .................. 0306414.4

(51) Int. Cl.
*C09K 11/06* (2006.01)
*C08G 73/02* (2006.01)
(Continued)

(52) U.S. Cl.
CPC ............ *C08G 73/026* (2013.01); *C08G 61/02* (2013.01); *C09K 11/06* (2013.01);
(Continued)

(58) Field of Classification Search
CPC ................. C08G 73/026; C09K 11/06; C09K 2211/1416; C09K 2211/1433; H01L 51/0035; H01L 51/0059; H05B 33/14
(Continued)

(56) References Cited

U.S. PATENT DOCUMENTS 4,539,507 A  9/1985  VanSlyke et al. ............ 313/504
5,723,873 A  3/1998  Yang .............................. 257/40
(Continued)

FOREIGN PATENT DOCUMENTS

EP  0 901 176  3/1999
EP  1 229 063  8/2002
(Continued)

OTHER PUBLICATIONS

Michaelson, "The work function of the elements and its periodicity," *J. Appl. Phy.*, 48(11):4729-4733 (1977).
(Continued)

*Primary Examiner* — Jennifer Chriss
*Assistant Examiner* — Camie Thompson
(74) *Attorney, Agent, or Firm* — Marshall, Gerstein & Borun LLP

(57) ABSTRACT

A polymer comprising a first repeat unit of formula (I), wherein each Ar is independently selected from optionally substituted aryl or heteroaryl and the group of formula (I) is present in a molar ratio of less than or equal to 10%, and, optionally, a second, optionally substituted repeat unit having a single nitrogen atom in its backbone of formula —Ar—N(Ar)—Ar— in a molar ratio of no greater than 5%.

9 Claims, 2 Drawing Sheets

(51) Int. Cl.
*C08G 61/02* (2006.01)
*H05B 33/14* (2006.01)
*H01L 51/00* (2006.01)

(52) U.S. Cl.
CPC ......... *H01L 51/0043* (2013.01); *H05B 33/14* (2013.01); *C09K 2211/1416* (2013.01); *C09K 2211/1433* (2013.01); *H01L 51/0035* (2013.01); *H01L 51/0039* (2013.01); *H01L 51/0059* (2013.01)

(58) Field of Classification Search
USPC ........... 428/690, 917; 313/504, 506; 257/40, 257/E51.018, E51.026; 528/422, 394, 397
See application file for complete search history.

(56) References Cited

U.S. PATENT DOCUMENTS

| | | | | |
|---|---|---|---|---|
| 5,798,170 | A | 8/1998 | Zhang et al. | 428/212 |
| 6,309,763 | B1 * | 10/2001 | Woo et al. | 428/690 |
| 6,353,083 | B1 | 3/2002 | Inbasekaran et al. | 528/295 |
| 7,531,831 | B2 * | 5/2009 | Tierney et al. | 257/40 |
| 7,632,908 | B2 * | 12/2009 | O'Dell et al. | 528/4 |
| 2005/0209422 | A1 * | 9/2005 | O'Dell et al. | 526/310 |

FOREIGN PATENT DOCUMENTS

| | | |
|---|---|---|
| WO | WO 90/13148 | 11/1990 |
| WO | WO 98/05187 | 2/1998 |
| WO | WO 98/10621 | 3/1998 |
| WO | WO 98/57381 | 12/1998 |
| WO | WO 99/48160 | 9/1999 |
| WO | WO 99/54385 | 10/1999 |
| WO | WO 00/46321 | 8/2000 |
| WO | WO 00/53656 | 9/2000 |
| WO | WO 00/55927 | 9/2000 |
| WO | WO 01/62869 | 8/2001 |
| WO | WO 02/084759 | 10/2002 |
| WO | WO 02/092723 | 11/2002 |
| WO | WO 02/092724 | 11/2002 |
| WO | WO 03/012891 | 2/2003 |
| WO | WO 03/095586 | 11/2003 |
| WO | WO 2004/023573 | 3/2004 |

OTHER PUBLICATIONS

Niu et al., "Thermal annealing below the glass transition temperature: A general way to increase performance of light-emitting diodes based on copolyfluorenes," *Appl. Phys. Lett.*, 81(4):634-636 (2002).
Yang et al., "Efficient polymer light emitting diodes with metal fluoride/Al cathodes," *Appl. Phys. Lett.*, 79(5):563-565 (2001).
Kreyenschmidt, et al. "Thermally Stable Blue-Light-Emitting Copolymers of Poly(alkylfluorene)," Macromolecules 31:1099-1103 (1998).
Kobayashi, et al. "A novel RGB multicolor light-emitting polymer display," Synthetic Metals 111-112:125-128 (2000).
Ramsdale et al. "The optical constants of emitter and electrode materials in polymer light-emitting diodes," J. Phys. D: Appl. Phys. 36:L29-L34 (2003).
International Search Report from PCT/GB04/001207 dated Jun. 28, 2004.
Written Opinion from PCT/GB04/001207 dated Jun. 28, 2004.
Combined Search and Examination Report from GB 0306414.4 dated Aug. 18, 2003.

* cited by examiner

POLYMERS, THEIR PREPARATION AND USES

FIELD OF THE INVENTION

The invention relates to materials for optical devices, in particular organic electroluminescent devices, and the control of their physical and electronic properties.

BACKGROUND OF THE INVENTION

One class of opto-electrical devices is that using an organic material for light emission or detection. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO 90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent first electrode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium. Other layers can be added to the device, for example to improve charge injection from the electrodes to the electroluminescent material. For example, a hole injection layer such as poly(ethylene dioxythlophene)/polystyrene sulfonate (PEDOT-PSS) or polyaniline may be provided between the anode and the electroluminescent material. When a voltage is applied between the electrodes from a power supply one of the electrodes acts as a cathode and the other as an anode For organic semiconductors important characteristics are the binding energies, measured with respect to the vacuum level of the electronic energy levels, particularly the "highest occupied molecular orbital" (HOMO) and the "lowest unoccupied molecular orbital" (LUMO) level. These can be estimated from measurements of photoemission and particularly measurements of the electrochemical potentials for oxidation and reduction. It is well understood in this field that such energies are affected by a number of factors, such as the local environment near an interface, and the point on the curve (peak) from which the value is determined. Accordingly, the use of such values is indicative rather than quantitative.

In operation, holes are injected into the device through the anode and electrons are injected into the device through the cathode. The hales and electrons combine in the organic electroluminescent layer to form an exciton which then undergoes radiative decay to give light. One way of improving efficiency of devices is to provide hole and electron transporting materials—for example, WO 99/48610 discloses blending of hole transporting polymers, electron transporting polymers and electroluminescent polymers. A 1:1 copolymer of dioctylfluorene and triphenylamine is used as the hole transporting polymer in this document.

A focus in the field of polymer OLEDs is the development of full color displays for which red, green and blue emissive materials are required. One drawback with existing polymer OLED displays relevant to this development is the relatively short lifetime of blue emissive materials known to date (by "lifetime" is meant the time for the brightness of the OLED to halve at constant current when operated under DC drive).

In one approach, the lifetime of the emissive material may be extended by optimisation of the OLED architecture; for example lifetime of the blue material may in part be dependant on the cathode being used. However, the advantage of selecting a cathode that improves blue lifetime may be offset by disadvantageous effects of the cathode on performance of red and green materials. For example, Synthetic Metals 111-112 (2000), 125-128 discloses a full color display wherein the cathode is LiF/Ca/Al. The present inventors have found that this cathode is particularly efficacious with respect to the blue emissive material but which shows poor performance with respect to green and, especially, red emitters.

Another approach is development of novel blue electroluminescent materials. For example, WO 00/55927, which is a development of WO 99/48160, discloses a blue electroluminescent polymer of formula (a):

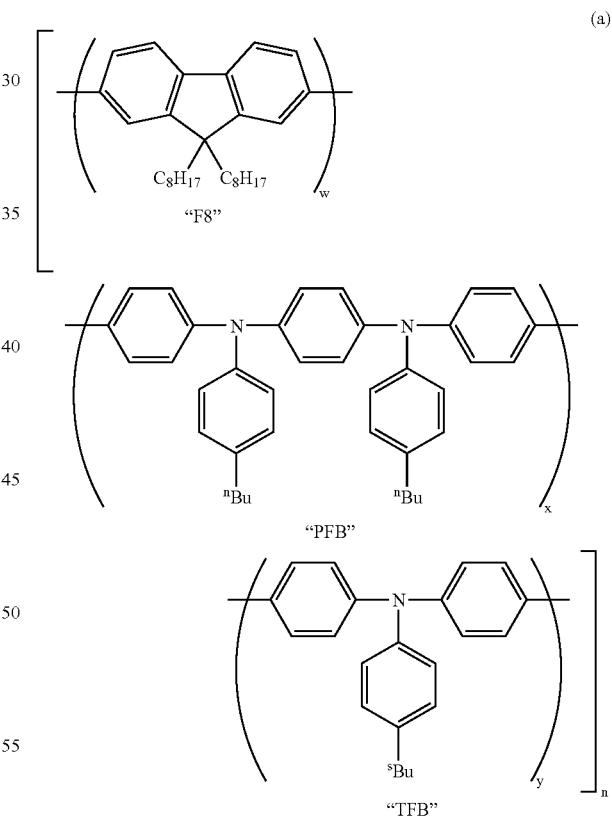

wherein $w+x+y=1$, $w \geq 0.5$, $0 \leq x+y \leq 0.5$ and $n \geq 2$

In essence, the separate polymers disclosed in WO 99/48160 are combined into a single molecule. The F8 repeat unit is provided for the purpose of electron injection; the TFB unit is provided for the purpose of hole transport; and the PFB repeat unit is provided as the emissive unit. The combination of units into a single polymer may be preferable to a blend, for example intramolecular charge transport may be preferable to intermolecular charge transport, potential difficulties of phase separation in blends is avoided.

WO 02/92723 and WO 02/92724 disclose replacement of some of the F8 repeat units in the polymer illustrated above with 9,9-diarylfluorene repeat units which has surprisingly been found to improve lifetime of the polymer.

WO 99/54385 and EP 1229063 disclose copolymers of fluorenes and PFB-type triarylamine repeat units. EP 1229063 discloses a copolymer of F8:TFB in a 70:30 ratio. It is an object of the present invention to provide long lived blue electroluminescent polymers, in particular blue electroluminescent polymers that are suitable for use in a full colour electroluminescent display.

GENERAL DESCRIPTION OF THE INVENTION

The present inventors have surprisingly found that reduction in the quantity of PFB leads to improved efficiency in certain device architectures, in particular for full color displays. Furthermore, the present inventors have surprisingly found that it is unnecessary to have separate hole transporting units and blue emissive units; it has been found that both functions may be performed by the PFB unit. Surprisingly, the omission of TFB from the prior art polymers described above is found to result in a significant improvement in lifetime.

Accordingly, in a first aspect the invention provides a polymer comprising a first repeat unit of formula (I):

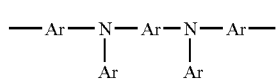

(I)

wherein each Ar is independently selected from optionally substituted aryl or heteroaryl and the group of formula (I) is present in a molar ratio of less than or equal to 10%, and, optionally, a second, optionally substituted repeat unit having a single nitrogen atom in its backbone of formula —Ar—N(Ar)—Ar— in a molar ratio of no greater than 5%.

Preferably, each Ar is phenyl. More preferably, the first repeat unit comprises an optionally substituted repeat unit of formula (II):

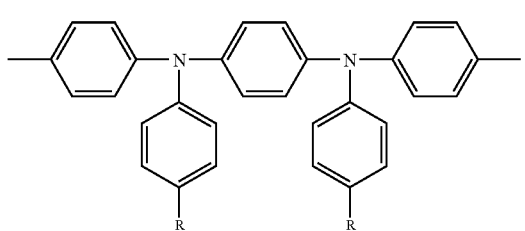

(II)

wherein each R is selected from hydrogen or a solubilising group.

Preferably, the second repeat unit is absent from the polymer. Preferably, there are no repeat units comprising nitrogen atoms in the repeat unit backbone other than the repeat unit of formula (I).

Preferably, the polymer comprises a further repeat unit selected from optionally substituted fluorene, spirofluorene, indenofluorene, phenylene or oligophenylene, preferably fluorene, more preferably 9,9-disubstituted fluorene-2,7-diyl.

Particularly preferred further repeat units are selected from optionally substituted repeat units of formula (III):

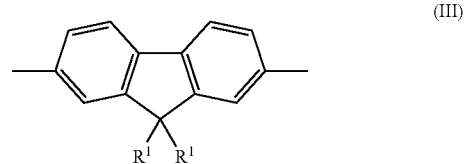

(III)

wherein each $R^1$ is independently selected from optionally substituted alkyl, alkoxy, aryl and heteroaryl. Particularly preferred substituents $R^1$ are selected from branched or linear $C_{1-10}$ alkyl and hydrocarbyl aryl.

Preferably, each $R^1$ is independently selected from the group comprising an optionally

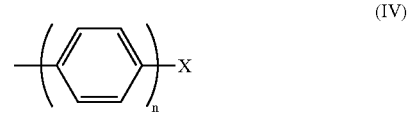

(IV)

substituted residue of formula (IV):
wherein n=1, 2 or 3 and X is a solubilising group or hydrogen.

Preferred solubilising groups X are selected from optionally substituted alkyl or alkoxy, more preferably butyl, most preferably n-butyl.

Preferably, the polymer according to the first aspect of the invention comprises less than 50 mol %, more preferably 1040 mol %, of repeat units of formula (II) wherein each $R^1$ is aryl.

Preferably, a polymer according to the first aspect of the invention comprises a further repeat unit selected from optionally substituted 9,9-dialkyl- or 9,9-dialkoxy-2,7-fluorenyl, more preferably 9,9-di(n-octyl)fluorene.

Preferably, the polymer according to the invention is capable of electroluminescence in the wavelength range 400-500 nm, most preferably 430-500 nm.

In a second aspect, the invention comprises an optical device comprising an anode, a cathode and a polymer according to the first aspect of the invention located between the anode and cathode.

An improvement in efficiency was found to be particularly marked in devices wherein the cathode has a relatively high workfunction (wf), causing it to be a relatively poor electron injector, for example barium (wf=2.7 eV), strontium (wf=2.59 eV) and calcium (wf=2.87 eV) (source: J. Appl. Phys. 48(11) 1977, 4729). Accordingly, in a preferred embodiment of the second aspect of the invention the cathode comprises a high workfunction metal, preferably barium, more preferably elemental barium.

BRIEF DESCRIPTION OF THE DRAWINGS

The present invention will now be described in further detail, by way of example only, with reference to the accompanying drawings in which.

DETAILED DESCRIPTION OF THE INVENTION

Polymers according to the invention are preferably copolymers comprising the first repeat unit of the invention and a further repeat unit, particularly an arylene co-repeat unit such as a fluorene, particularly 2,7-linked 9,9 dialkyl fluorene or 2,7-linked 9,9 diaryl fluorene; a spirofluorene such as 2,7-linked 9,9-spirofluorene; an indenofluorene such as a 2,7-linked indenofluorene; a phenyl such as alkyl or alkoxy substituted 1,4-phenylene; or a heteroarylene repeat unit which may comprise one or more than one heteroaryl rings, for example a trimer repeat unit comprising three conjugatively linked repeat units. Each of these groups may be substituted. Preferred arylene and heteroarylene further repeat units are those that are fully conjugated along the repeat unit backbone, i.e. that form a conjugated link between two repeat units on either side of the further repeat unit in the polymer backbone.

Other examples of suitable further repeat units are disclosed in, for example, WO 00/55927 and WO 00/46321, the contents of which are incorporated herein by reference.

A polymer according to the present invention may be a homopolymer, copolymer, terpolymer or higher order polymer.

A copolymer, terpolymer or higher order polymer according to the present invention includes regular alternating, random and block polymers where the percentage of each monomer used to prepare the polymer may vary.

For ease of processing, it is preferred that the polymer is soluble. Substituents such as $C_{1-10}$ alkyl or $C_{1-10}$ alkoxy may usefully be selected to confer on the polymer solubility in a particular solvent system. Typical solvents include mono or poly-alkylated benzenes such as toluene and xylene or THF.

Two polymerisation techniques that are particularly amenable to preparation of conjugated polymers from aromatic monomers are Suzuki polymerisation as disclosed in, for example, WO 00/53656 and Yamamoto polymerisation as disclosed in, for example, "Macromolecules", 31, 1099-1103 (1998). Suzuki polymerisation entails the coupling of halide and boron derivative functional groups; Yamamoto polymerisation entails the coupling of halide functional groups. Accordingly, it is preferred that each monomer is provided with two reactive functional groups P wherein each P is independently selected from the group consisting of (a) boron derivative functional groups selected from boronic acid groups, boronic ester groups and borane groups and (b) halide functional groups.

Figure 1:
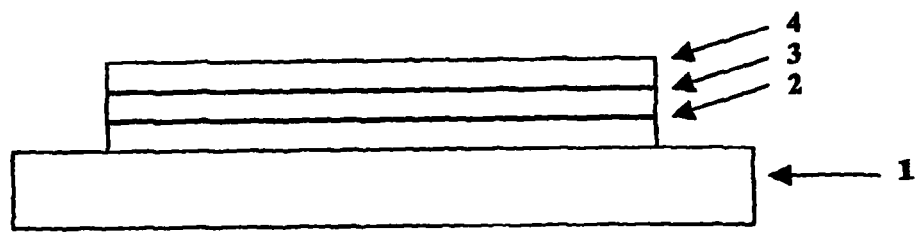
FIG. 1 shows a prior art electroluminescent device

With reference to FIG. 1, the standard architecture of an optical device according to the invention, in particular an electroluminescent device, comprises a transparent glass or plastic substrate 1, an anode of Indium tin oxide 2 and a cathode 4. The polymer according to the invention is located in layer 3 between anode 2 and cathode 4. Layer 3 may comprise the polymer according to the invention alone or a plurality of polymers. Where a plurality of polymers are deposited, they may comprise a blend of at least two of a hole transporting polymer, an electron transporting polymer and, where the device is a PLED, an emissive polymer as disclosed in WO 99/48160. Alternatively, layer 3 may be formed from a single polymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region. Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869.

In addition to layer 3, a separate hole transporting layer and/or an electron transporting layer may be provided.

Although not essential, a layer of organic hole injection material (not shown) between the anode 2 and the polymer layer 3 is desirable because it assists hole injection from the anode into the layer or layers of semiconducting polymer. Examples of organic hole injection materials include poly (ethylene dioxythiophene) (PEDT/PSS) as disclosed in EP 0901176 and EP 0947123, or polyaniline as disclosed in U.S. Pat. No. 5,723,873 and U.S. Pat. No. 5,798,170.

Cathode 4 is selected from materials that has a workfunction allowing injection of electrons into the electroluminescent layer. Other factors influence the selection of the cathode such as the possibility of the adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 563.

A typical electroluminescent device comprises an anode having a workfunction of 4.8 eV. Accordingly, the HOMO level of the hole transporting region is preferably around 4.8-5.5 eV. Similarly, the cathode of a typical device will have a workfunction of around 3 eV. Accordingly, the LUMO level of the electron transporting region is preferably around 3-3.5 eV.

Electroluminescent devices may be monochrome devices or full color devices (i.e. formed from red, green and blue electroluminescent materials).

EXAMPLES

Monomer Examples

Monomers according to the invention were prepared in accordance with the scheme below:

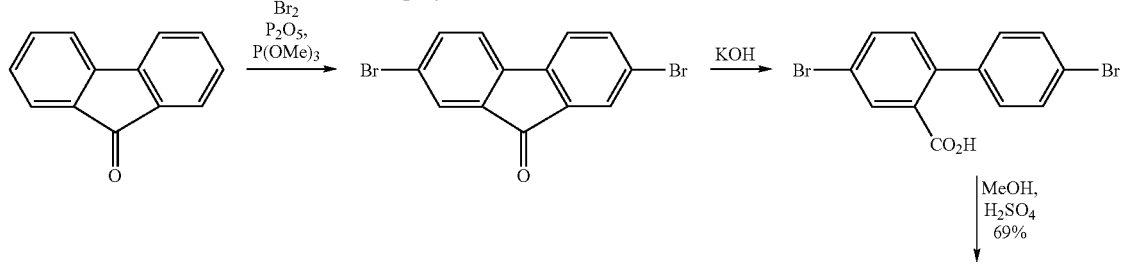

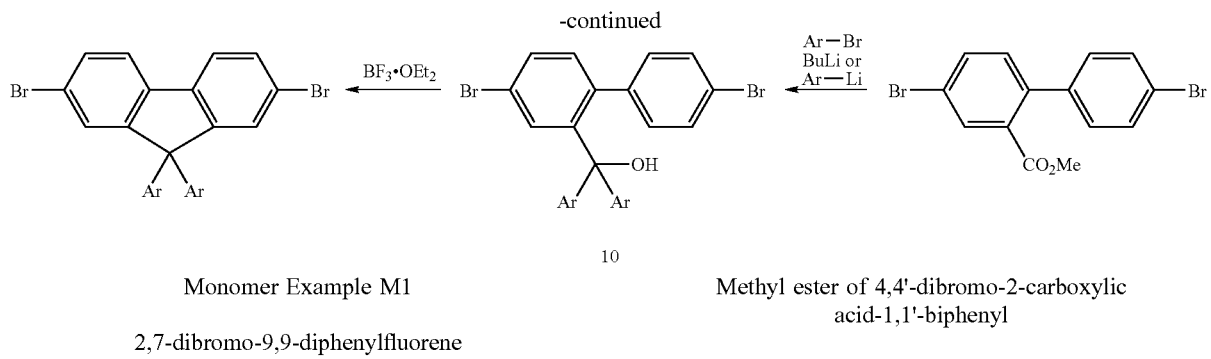

Monomer Example M1

2,7-dibromo-9,9-diphenylfluorene

2,7-Dibromofluorenone

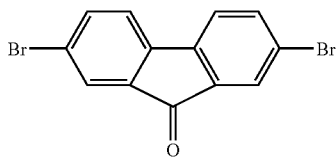 [SMILES: O=C1c2cc(Br)ccc2-c2ccc(Br)cc21]

In a 3 L flange flask fluorencone (100.006 g, 0.555 mol), phosphorus pentoxide (110.148 g, 0.776 mol) and trimethylphosphate (1200 mL) were mixed. Under mechanical stirring, a solution of bromine (63 mL, 1.23 mol) in trimethylphosphate (200 mL) was quickly added. This clear solution was then heated for 22 hours at 120° C. The mixture was allowed to cool to room temperature, then poured into 3 L of water. When sodium thiosulfate was added (50.045 g) the mixture turned yellow. Stirring was maintained for 1 hour then the yellow solid was filtered. This solid was heated in methanol to remove the mono-brominated compound and gave 176.183 g (98% pure by HPLC, 94% yield).
$^1$H NMR (CDCl$_3$) 7.73 (2H, d, J 2.0), 7.61 (2H, dd, J 7.6, 2.0), 7.36 (2H, d, J 8.0) $^{13}$C NMR (CDCl$_3$) 142.3, 137.5, 135.3, 127.9, 123.3, 121.8, 109.8.

4,4'-Dibromo-2-carboxylic acid-1,1'-biphenyl

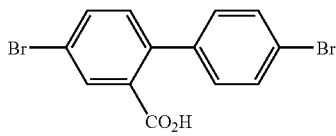

In a 2 L flange flask 2,7-dibromofluorenone (120.526 g, 0.356 mol), potassium hydroxide (finely powdered flakes, 168.327 g, 3.000 mol) and toluene (600 mL) were placed. This mixture was heated at 120° C. for four hours then left to cool to room temperature. Water was added to dissolve the solid (~2 L) under vigorous stirring. The greenish aqueous layer was removed and the yellow toluene layer was washed twice with water. The combined aqueous layers were acidified with concentrated hydrochloric acid then the precipitated solid was filtered, dried then recrystallised from toluene to give 100.547 g of off white crystals (79% yield); $^1$H NMR ((CD$_3$)$_2$CO) 8.00 (1H, d, J 2.0), 7.77 (1H, dd, J 8.0, 2.4), 7.57 (2H, d, J 8.0), 7.34 (1H, d, J 8.4), 7.29 (2H, d, J 8.8); $^{13}$C NMR ((CD$_3$)$_2$CO) 167.1, 140.4, 139.8, 134.2, 133.5, 132.8, 132.7, 131.2, 130.6, 121.4, 121.1.

Methyl ester of 4,4'-dibromo-2-carboxylic acid-1,1'-biphenyl

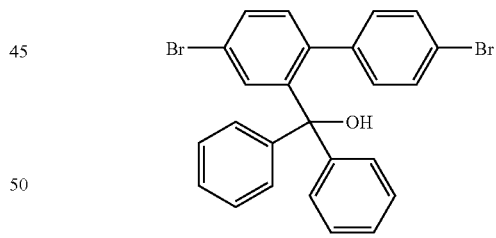

4,4-dibromo-2-carboxylic acid biphenyl (171.14 g, 0.481 mol) was suspended in methanol (700 mL) and sulfuric acid (15 mL) then heated at 80° C. for 21 hours. The solvent was removed and the oil was dissolved in ethyl acetate. This solution was washed with 2N sodium hydroxide, water, saturated sodium chloride, dried over magnesium sulfate, filtered and evaporated to give an orange oil. This oil was treated with hot methanol, on cooling the ester precipitated out and was filtered. The mother liquor was evaporated and the solid recrystallised giving additional product. The ester was 100% pure by GCMS, a yield of 123.27 g (69%) was obtained; $^1$H NMR (CDCl$_3$) 7.99 (1H, d, J 2.0), 7.64 (1H, dd, J 8.0, 1.6), 7.51 (2H, d, J 8.4), 7.19 (1H, d, J 8.8), 7.13 (2H, d, J 8.8), 3.67 (3H, s); $^{13}$C NMR (CDCl$_3$) 167.1, 140.3, 139.1, 134.4, 132.9, 132.1, 132.0, 131.3, 129.8, 121.9, 121.5, 52.3; GCMS: M$^+$=370

4,4'-dibromo-2-diphenyl alcohol-1,1'-biphenyl 4,4-dibromo-2-methyl ester-biphenyl (24.114 g, 65.1 mmol) was dissolved in dry diethyl ether (120 mL) and the solution was cooled to −60° C. by using an isopropanol/dry ice bath. Phenyl lithium (1.8M solution in cyclohexane-ether, 91 mL) was then added dropwise. The mixture was stirred and let to warm to room temperature. The reaction was complete after four hours. Water was added (70 mL) then the aqueous layer washed once with diethyl ether. Combined organic phases were washed with sodium chloride, dried over magnesium sulfate, filtered and evaporated to give a yellow powder. Recrystallisabon from isopropanol afforded 19 g of white solid (59% yield); GC-MS (m/z, relative intensity %) 494 (M$^+$, 100); $^1$H NMR (CDCl$_3$) 7.43 (1H, dd, J 8.4, 2.4), 7.28 (6H, m), 7.23 (2H, d, J 8.0), 7.11

(4H, m), 6.99 (1H, d, J 2.4), 6.94 (1H, d, J 8.4), 6.61 (2H, d, J 8.4); $^{13}$C NMR (CDCl$_3$) 147.5, 146.7, 140.3, 139.3, 134.0, 133.0, 131.2, 131.1, 130.3, 128.2, 128.1, 127.8, 121.8, 121.3, 83.2.

2,7-dibromo-9,9-diphenylfluorene

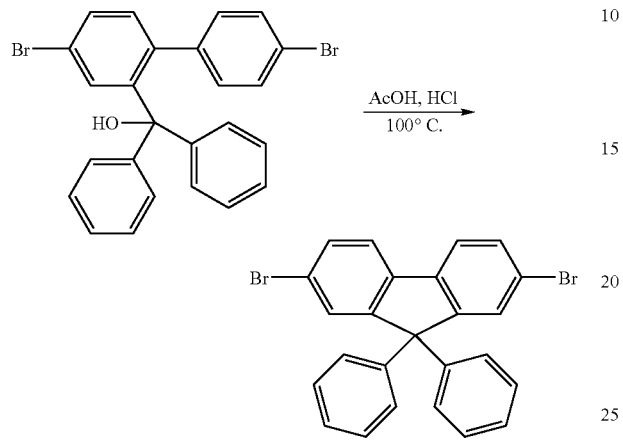

The alcohol (69.169 g, 140 mmol) and glacial acetic acid (450 ml) were stirred and heated to reflux, then concentrated hydrochloric acid (0.5 ml) was added dropwise. When the addition was completed the mixture was heated for one hour and then cooled. The reaction mixture was poured into water (500 ml), after which the solid was filtered off. The white solid was recrystallised from n-butyl acetate three times to give 20.03 g of desired product (99.59% by HPLC, 30% yield).

$^1$H NMR (CDCl$_3$), δ/ppm: 7.58 (2H, d, J 7.6), 7.49 (2H, d, 1.2), 7.48 (2H, dd, 1.6), 7.25 (6H, m), 7.14 (4H, m).

$^{13}$C NMR (CDCl$_3$), δ/ppm: 153.2, 144.6, 138.3, 131.1, 129.6, 128.7, 128.2, 127.4, 122.0, 121.7, 65.8.

Monomer Examples M2-M4

Monomers with Ar groups as detailed in the table below were prepared in accordance with the scheme and general experimental process outlined above. Aryllithium compounds corresponding to Ar groups shown in the table were prepared from the corresponding aryl bromide.

| Monomer example no. | Ar | Yield of monomer |
|---|---|---|
| M2 | (4-tert-butylphenyl) | 90% |
| M3 | (biphenyl) | 24% |
| M4 | (4'-tert-butylbiphenyl) | 22% |

Polymer Example P1

A blue electroluminescent polymer according to the invention was prepared in accordance with the process of WO 00/53656 by reaction of 9,9-di-n-ooctylfluorene-2,7-di (ethylenylboronate) (0.65 equivalents), 2,7-dibromo-9,9-diphenylfluorene (0.30 equivalents) and N,N'-di(4-bromophenyl)-N,N'-di(4-n-butylphenyl)-1,4-diaminobenzene (0.05 equivalents) to give polymer P1:

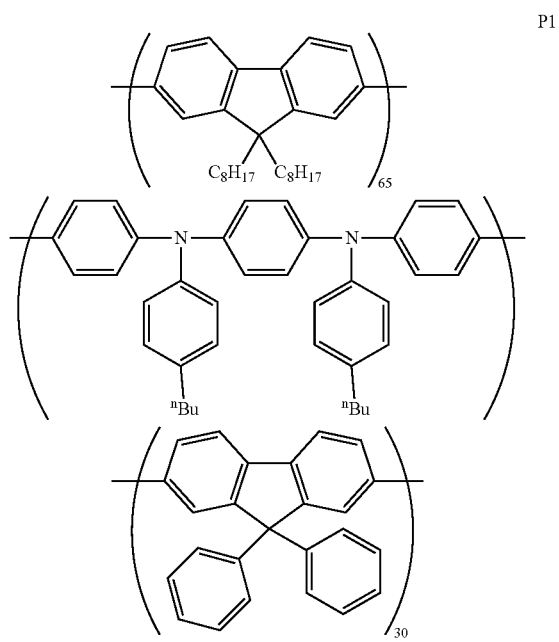

Device Example

Onto indium tin oxide supported on a glass substrate (available from Applied Films, Colorado, USA) was deposited a layer of PEDT/PSS, available from Bayer® as Baytron P® by spin coating. A layer of polymer P1 was deposited over the PEDT/PSS layer by spin-coating from xylene solution. Onto the polymer P1 was deposited by evaporation a cathode consisting of a first layer of barium and a second, capping layer of silver.

For the purpose of comparison, identical devices were prepared except that molar ratio of PFB repeat units was varied. As can be seen, lifetime at amine contents of 10% or lower is significantly higher than those above 10%.

| Amine content (%) | Lifetime starting from 400 cd/m$^2$ |
|---|---|
| 5 | 228 |
| 10 | 125 |
| 15 | 69 |
| 20 | 48 |

Figure 2:
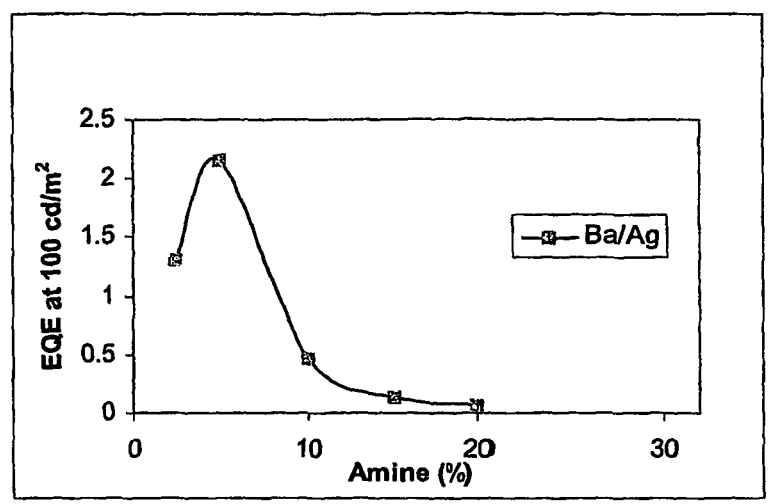
FIG. 2 shows a plot of external quantum efficiency vs. polymer amine content

Furthermore, as can be seen from FIG. 2, efficiency is significantly higher at molar ratios at or below 10%.

Without wishing to be bound by any theory, the improvement in efficiency with a barium cathode is believed to be due to the low hole transporting capability of the polymer according to the invention resulting from the low number of repeat units of formula (I). Barium is a relatively poor electron injector and so matches the lower hole current of materials according to the invention.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. An optical device comprising an anode, a cathode and a terpolymer located between the anode and cathode, the terpolymer comprising an optionally substituted repeat unit of formula (II):

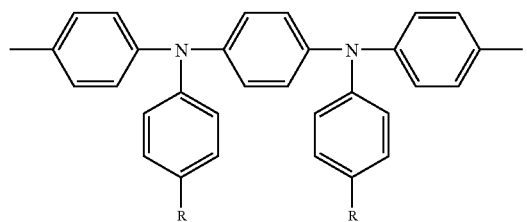

(II)

wherein each R is independently selected from hydrogen, alkyl, and alkoxy and the group of formula(II) is present in a molar ratio of 2.5% to 5%, and there are no repeat units comprising nitrogen atoms in the repeat unit backbone other than the repeat unit of formula (II), the terpolymer further comprising a first repeat unit selected from the group consisting of optionally substituted 9,9-dialkyl-2,7-fluorenyl and 9,9-dialkoxy-2,7-fluorenyl and less than 50 mol % of a second repeat unit selected from the group consisting of optionally substituted repeat units of formula (III):

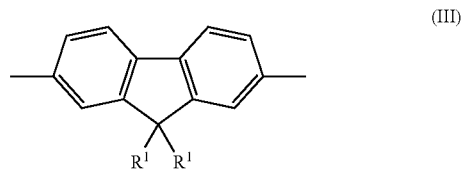

(III)

wherein each $R^1$ is aryl.

2. An optical device according to claim 1 wherein the cathode comprises a layer comprising barium.

3. An optical device according to claim 2 wherein the cathode comprises a layer comprising elemental barium.

4. An optical device according to claim 1 that is an electroluminescent device.

5. An optical device according to claim 1 that is capable of electroluminescence in the wavelength range 400-500 nm.

6. An optical device according to claim 1 wherein the terpolymer is not a component of a blend.

7. An optical device according to claim 1 that is a full color electroluminescent device comprising red, green and blue electroluminescent materials.

8. An optical device according to claim 7 wherein the blue electroluminescent material is said terpolymer.

9. An optical device according to claim 1 that is capable of electroluminescence in the wavelength range 430-500 nm.

* * * * *